(12) United States Patent
Tsai et al.

(10) Patent No.: US 10,665,693 B2
(45) Date of Patent: May 26, 2020

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Chun-Hsiung Tsai, Hsinchu County (TW); Kei-Wei Chen, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/866,594

(22) Filed: Sep. 25, 2015

(65) Prior Publication Data
US 2016/0322474 A1 Nov. 3, 2016

Related U.S. Application Data

(60) Provisional application No. 62/154,708, filed on Apr. 30, 2015.

(51) Int. Cl.
| | |
|---|---|
| *H01L 29/78* | (2006.01) |
| *H01L 29/66* | (2006.01) |
| *H01L 29/08* | (2006.01) |
| *H01L 29/165* | (2006.01) |

(52) U.S. Cl.
CPC .... *H01L 29/66636* (2013.01); *H01L 29/0847* (2013.01); *H01L 29/165* (2013.01); *H01L 29/7848* (2013.01)

(58) Field of Classification Search
CPC ............. H01L 29/7848; H01L 29/7842; H01L 21/324; H01L 21/477; H01L 29/66636
See application file for complete search history.

(56) References Cited

U.S. PATENT DOCUMENTS

| | | | | |
|---|---|---|---|---|
| 6,066,508 | A | * | 5/2000 | Tanabe ............... B01D 53/8671 438/38 |
| 6,111,225 | A | | 8/2000 | Ohkase et al. |
| 6,328,043 | B1 | * | 12/2001 | Kim ........................ C23C 16/42 134/22.1 |

(Continued)

FOREIGN PATENT DOCUMENTS

| | | |
|---|---|---|
| CN | 102487047 A | 6/2012 |
| CN | 102906880 A | 1/2013 |

(Continued)

OTHER PUBLICATIONS

Julius Su and William A. Goddard III (advisor)., "Dissociation and ionization of warm dense hydrogen." (2008).

(Continued)

*Primary Examiner* — Shaun M Campbell
*Assistant Examiner* — Suberr L Chi
(74) *Attorney, Agent, or Firm* — Maschoff Brennan

(57) ABSTRACT

A semiconductor structure includes a semiconductor substrate, n-type source and drain stressors, and a gate stack. The semiconductor substrate has source and drain recesses therein. The n-type source and drain stressors are respectively present in the source and drain recesses. At least one of the n-type source and drain stressors has a hydrogen terminated surface. A gate stack is present on the semiconductor substrate and between the n-type source and drain stressors.

20 Claims, 7 Drawing Sheets

(56) References Cited

U.S. PATENT DOCUMENTS

| | | |
|---|---|---|
| 2005/0173761 A1* | 8/2005 | Takafuji ............ H01L 21/02164 257/347 |
| 2005/0280123 A1 | 12/2005 | Lee |
| 2007/0187386 A1 | 8/2007 | Kim et al. |
| 2008/0006818 A1* | 1/2008 | Luo .................. H01L 29/66636 257/19 |
| 2008/0115808 A1* | 5/2008 | Ramachandran ......... B08B 7/00 134/19 |
| 2008/0182075 A1 | 7/2008 | Chopra et al. |
| 2009/0134381 A1* | 5/2009 | Shimamune ...... H01L 21/02381 257/19 |
| 2009/0148965 A1* | 6/2009 | Kim ..................... H01L 21/324 438/14 |
| 2009/0224293 A1* | 9/2009 | Miyanami ........... H01L 21/3105 257/288 |
| 2010/0224766 A1* | 9/2010 | Tateshita ........... H01L 21/82345 250/214.1 |
| 2011/0316044 A1 | 12/2011 | Chan et al. |
| 2013/0001591 A1 | 1/2013 | Wu et al. |
| 2015/0041854 A1 | 2/2015 | Wang et al. |
| 2015/0047704 A1* | 2/2015 | Bedell ................ H01L 31/0304 136/258 |
| 2016/0049313 A1* | 2/2016 | Kumar ................ H01L 21/3221 438/471 |

FOREIGN PATENT DOCUMENTS

| | | |
|---|---|---|
| KR | 10-0536809 B1 | 12/2005 |
| KR | 10-2013-0007412 A | 1/2013 |

OTHER PUBLICATIONS

Jung-Min Oh et al., "Prevention of Condensation Defects on Contact Patterns by Improving Rinse Process," Solid State Phenomena vols. 145-146 (2009) pp. 151-154.

Ruben Lieten., "Epitaxial Growth of Nitrides on Germanium." Uitgeverij VUBPRESS Brussels University Press., p. 100-102, 2008.

Min Dai et al., "Nitrogen interaction with hydrogen-terminated silicon surfaces at the atomic scale." Nature Materials 8, 825-830 (2009).

Robert Doering et al., "Handbook of Semiconductor Manufacturing Technology, Second Edition." CRC Press Taylor & francis Group, LLC., p. 13-3 (2008).

Richard E. Novak et al., "Cleaning Technology in Semiconductor Device Manufacturing IV." The Electrochemical Society, Inc., p. 352-353 (1996).

Bernd O. Kolbesen et al., "Cyrstalline Defects and Contamination: Their Impact and Control in Device Manufacturing IV-DECON 2005." The Electrochemical Society, Inc., p. 78 (2005).

* cited by examiner

SEMICONDUCTOR STRUCTURE AND MANUFACTURING METHOD THEREOF

PRIORITY CLAIM AND CROSS-REFERENCE

This application claims priority to U.S. Provisional Application Ser. No. 62/154,708, filed Apr. 30, 2015, which is herein incorporated by reference.

BACKGROUND

The present disclosure relates generally to semiconductor devices, and more specifically to integrated circuits (ICs) and fabrication methods thereof.

The semiconductor integrated circuit (IC) industry has experienced rapid growth. Technological advances in IC materials and design have produced generations of ICs where each generation has smaller and more complex circuits than the previous generation. To enhance the performance of ICs, strained silicon has been used to enhance carrier mobility and improve device performance. Strained silicon is a layer of silicon in which the silicon atoms are stretched beyond their normal interatomic distance. Moving these silicon atoms farther apart reduces the atomic forces that interfere with the movement of electrons through the transistors and thus better mobility, resulting in better chip performance and lower energy consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
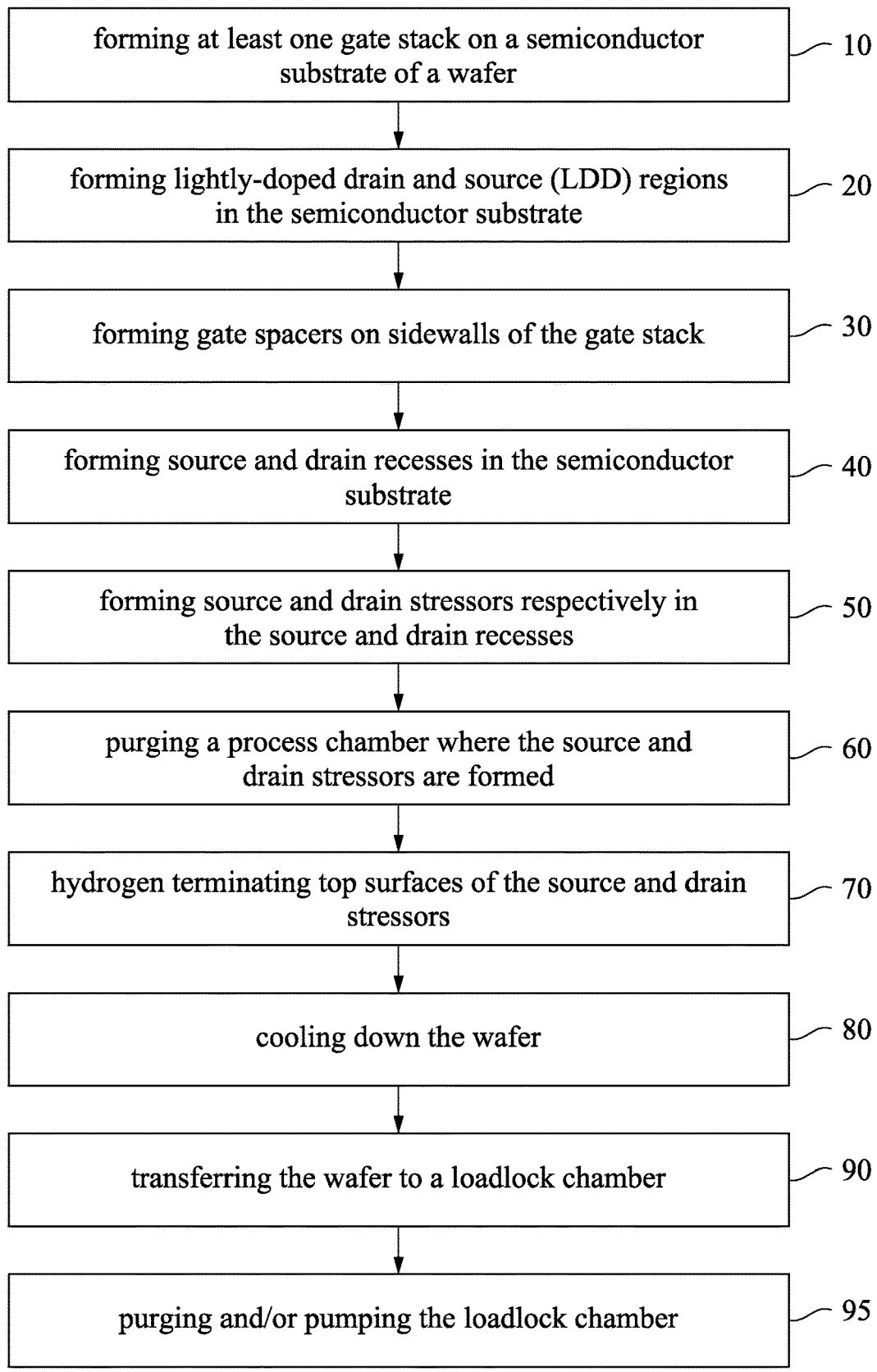
FIG. 1 is a flowchart of a method for manufacturing a metal-oxide-semiconductor (MOS) device in accordance with some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method for manufacturing a metal-oxide-semiconductor (MOS) device in accordance with some exemplary embodiments of the present disclosure. The method begins with block 10 in which at least one gate stack is formed on a semiconductor substrate of a wafer. The method continues with block 20 in which lightly-doped drain and source (LDD) regions are formed in the semiconductor substrate. The method continues with block 30 in which gate spacers are formed on sidewalls of the gate stack. The method continues with block 40 in which source and drain recesses are formed in the semiconductor substrate. The method continues with block 50 in which source and drain stressors are formed respectively in the source and drain recesses. The method continues with block 60 in which a process chamber where the source and drain stressors are formed are purged. The method continues with block 70 in which top surfaces of the source and drain stressors are hydrogen terminated. The method continues with block 80 in which the wafer is cooled down. The method continues with block 90 in which the wafer is transferred to a load lock chamber. The method continues with block 95 in which the load lock chamber is periodically purged and/or pumped.

Figure 2:
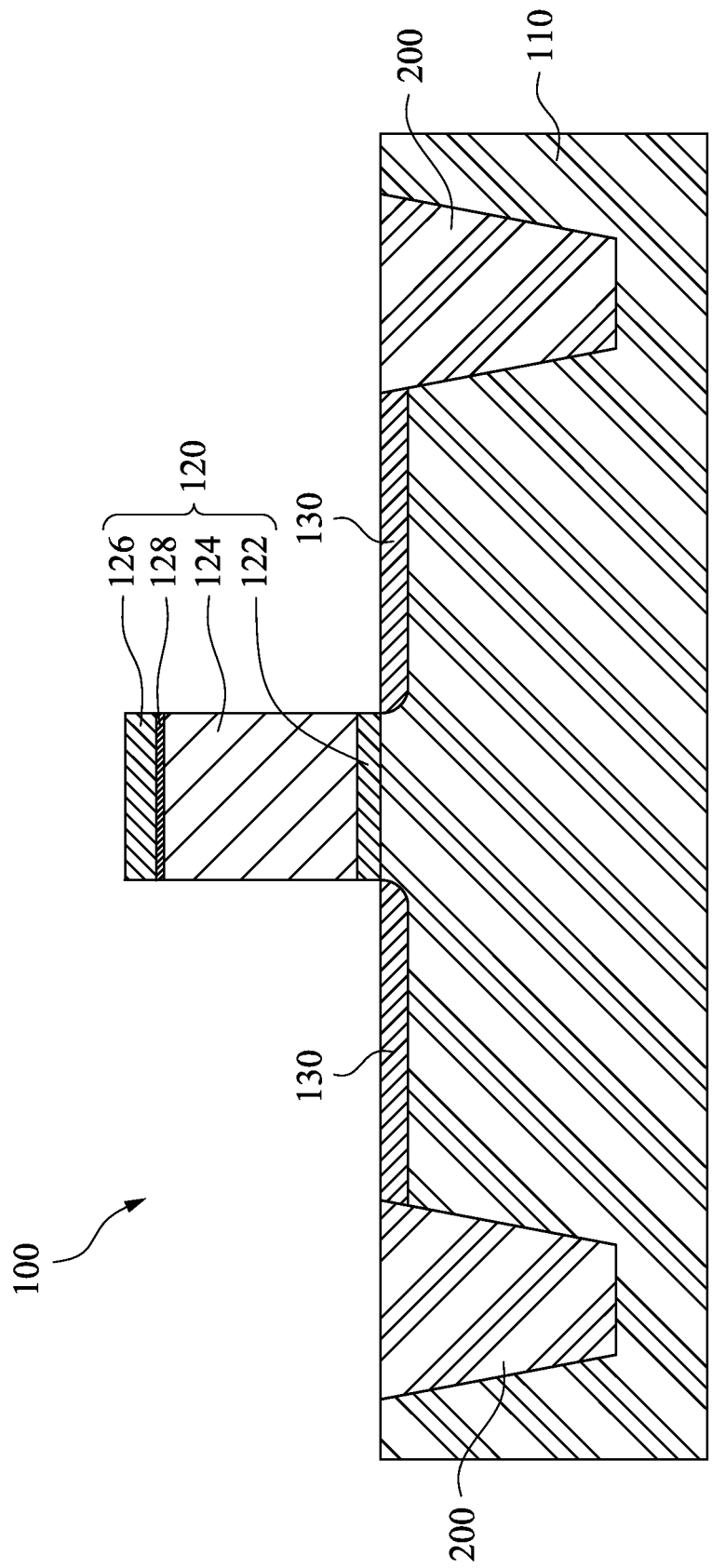
FIGS. 2-6 are cross-sectional views of intermediate stages in formation of a metal-oxide-semiconductor (MOS) device in accordance with some exemplary embodiments of the present disclosure.

FIGS. 2-6 are cross-sectional views of intermediate stages in formation of a metal-oxide-semiconductor (MOS) device in accordance with some exemplary embodiments of the present disclosure. Reference is made to FIG. 2. A wafer 100, which includes a semiconductor substrate 110, is provided. The semiconductor substrate 110 may be made of a semiconductor material, such as silicon, silicon carbide (SiC), silicon germanium (SiGe), an III-V compound semiconductor, combinations thereof, or the like. Isolation regions, such as shallow trench isolation (STI) regions 200, are formed in the semiconductor substrate 110 and are used to define the active region of the MOS device.

A gate stack 120 is formed on the semiconductor substrate 110 (block 10 of FIG. 1). The gate stack 120 includes a gate dielectric 122 and a gate electrode 124. The gate dielectric 122 includes silicon oxide in some exemplary embodiments. In alternative embodiments, other dielectric materials, such as silicon nitride, silicon carbide (SiC), and the like, are also used. The gate electrode 124 may include polysilicon. In some embodiments, the gate stack 120 further includes a hard mask 126 over the gate electrode 124. The hard mask 126 may include silicon nitride, for example, while other materials, such as silicon carbide (SiC), silicon oxynitride, and the like, may also be used. In some embodiments, the gate stack 120 further includes an oxide layer 128 between the hard mask 126 and the gate electrode 124 to adhere the hard mask 126 on the gate electrode 124. In alternative embodiments, the hard mask 126 and the oxide layer 128 are not formed.

Lightly-doped drain and source (LDD) regions 130 are formed by, for example, implanting an n-type impurity (such as phosphorous and/or arsenic) into the semiconductor substrate 110 (block 20 of FIG. 1). For example, when the resulting metal-oxide-semiconductor (MOS) device is an nMOS device, the LDD regions 130 are n-type regions. The gate stack 120 acts as an implantation mask, so that the edges of the LDD regions 130 are substantially aligned with the edges of the gate stack 120.

Figure 3:
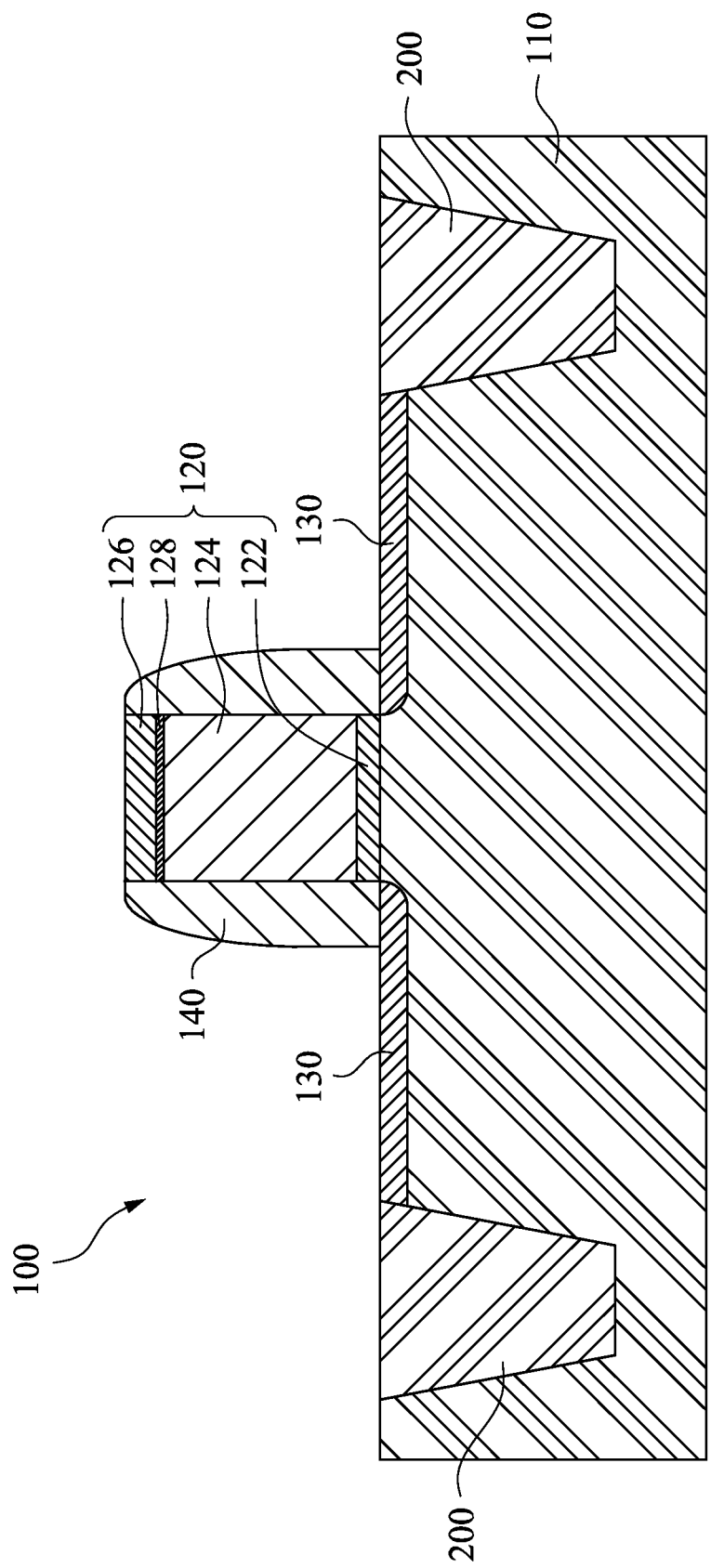

Reference is made to FIG. 3. Gate spacers 140 are formed on sidewalls of the gate stack 120 (block 30 of FIG. 1). In some embodiments, at least one of the gate spacers 140 include one or more layers, including silicon nitride, silicon oxynitride, silicon oxide, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Figure 4:
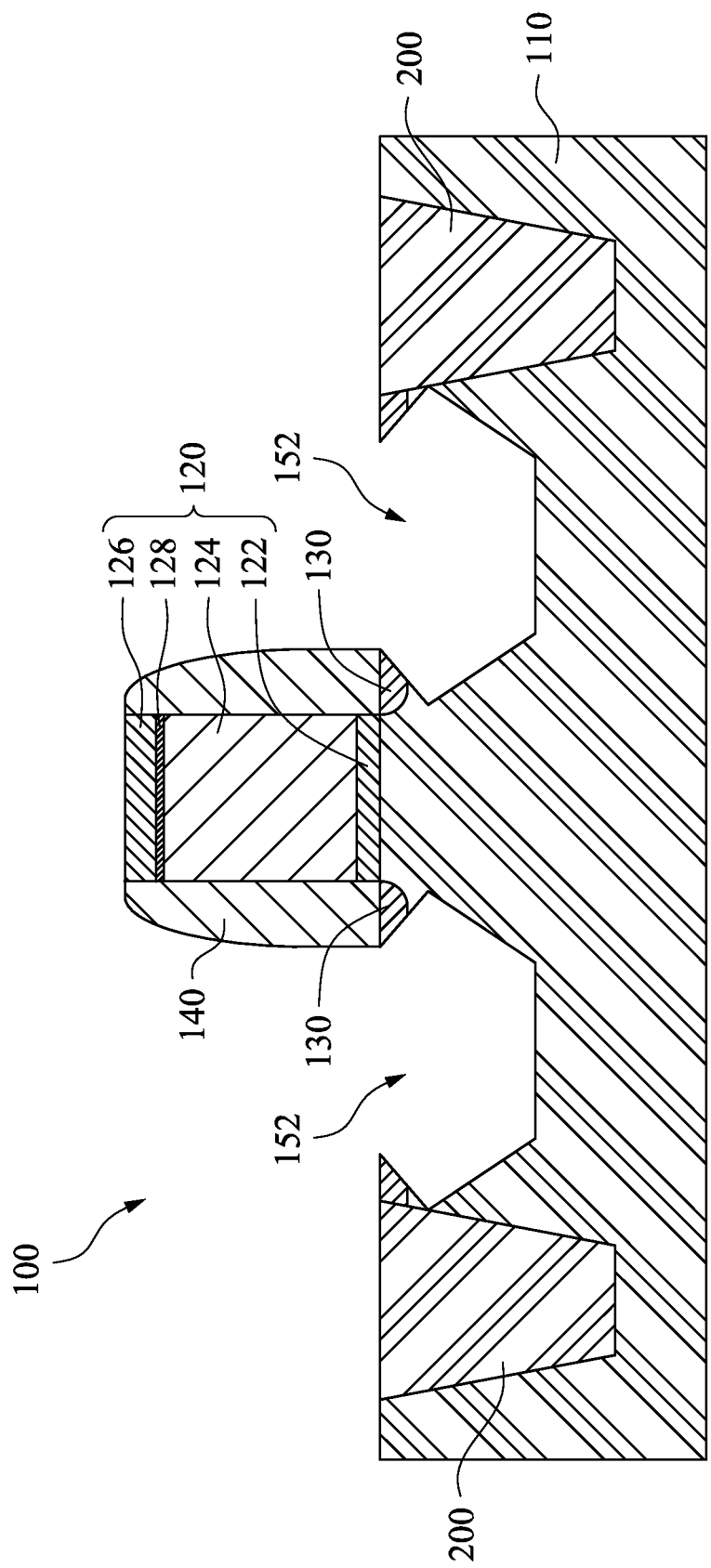

Reference is made to FIG. 4. Source and drain recesses 152 are formed in the semiconductor substrate 110 (block 40 of FIG. 1). The source and drain recesses 152 may be formed using, for example, a wet etch process selective to the material of the semiconductor substrate 110, and the wet etch process uses the gate stack 120 and the gate spacers 140 as a hard mask to form the source and drain recesses 152. For example, an etchant, such as carbon tetrafluoride ($CF_4$), tetramethylammonium hydroxide (THMA), combinations of these, or the like, may be used to perform the wet etch process and to form the source and drain recesses 152. The source and drain recesses 152 provide openings in the semiconductor substrate 110 into which source/drain regions will subsequently be formed.

Figure 5:
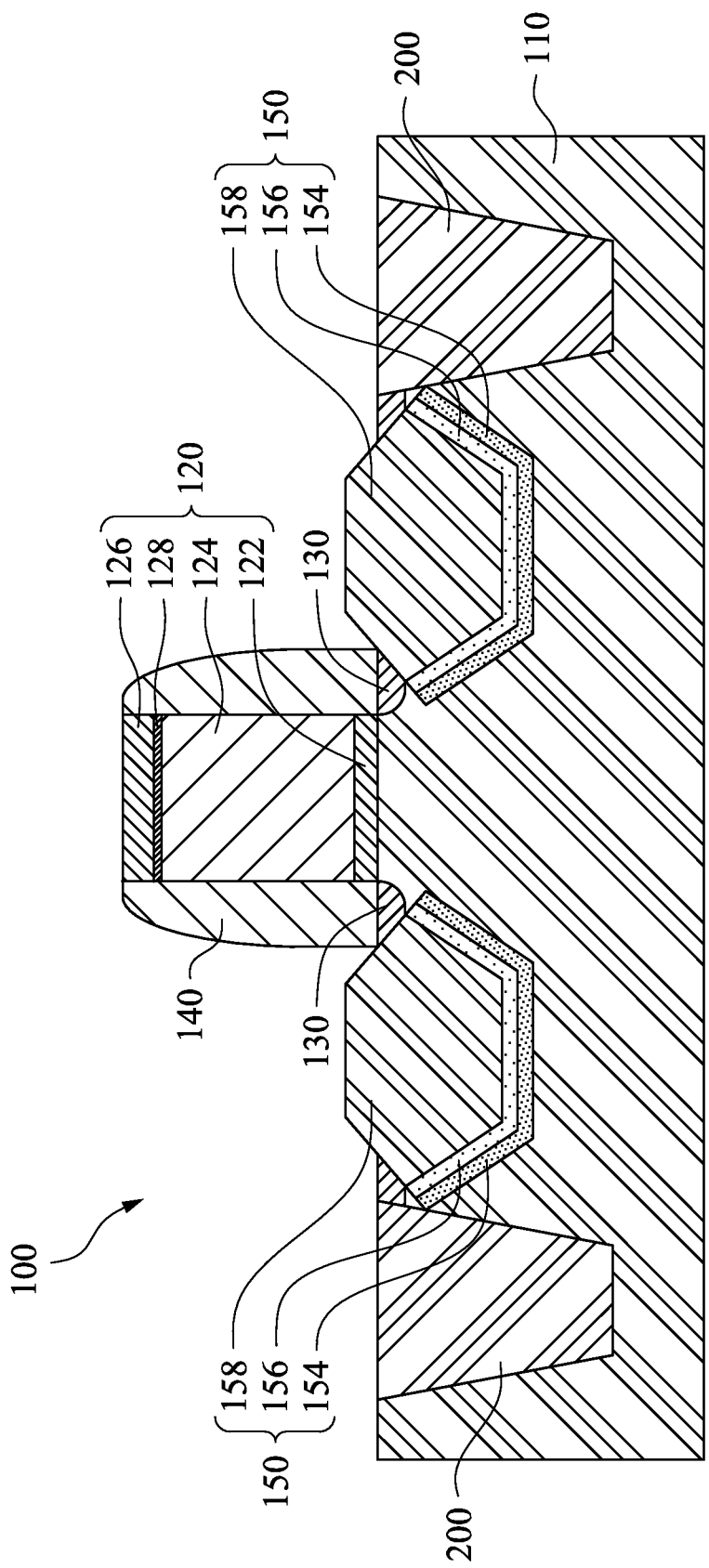

Reference is made to FIG. 5. Source and drain stressors 150 are respectively formed in the source and drain recesses 152 (as shown in FIG. 4) (block 50 of FIG. 1). In some embodiments, the source and drain stressors 150 may be formed by a cyclic deposition and etching (CDE) process. The CDE process includes an epitaxial deposition/partial etch process and repeating the epitaxial deposition/partial etch process at least once.

A first silicon-containing layer 154 is epitaxially deposited in the source and drain recesses 152 (as shown in FIG. 4). In some embodiments that the resulting metal-oxide-semiconductor (MOS) device is an nMOS device, the first silicon-containing layer 154 may be made of, for example, silicon, silicon carbide, other semiconductor materials, and/or combinations thereof. The deposition of the first silicon-containing layer 154 may use at least one silicon-containing precursor, such as silane ($SiH_4$), disilane ($Si_2H_6$), trisilane ($Si_3H_8$), dichlorosilane ($SiH_2Cl_2$), other silicon-containing precursors, and/or combinations thereof. In some embodiments, the silicon-containing precursor may have a flow rate in a range from about 20 standard cubic centimeters per minute (sccm) to about 500 sccm.

In some embodiments, the deposition of the first silicon-containing layer 154 may include in-situ doping the first silicon-containing layer 154. When the resulting metal-oxide-semiconductor (MOS) device is an nMOS device, an n-type doping precursor, for example, phosphine ($PH_3$) and/or other n-type doping precursors, may be used. In some embodiments, the n-type doping precursor may have a flow rate in a range from about 20 standard cubic centimeters per minute (sccm) to about 500 sccm.

In some embodiments, the deposition of the first silicon-containing layer 154 may use a carrier gas to introduce the silicon-containing precursor and the n-type doping precursor into the process chamber. The carrier gas may be, for example, nitrogen gas ($N_2$), hydrogen gas ($H_2$), or combinations thereof. In some embodiments, the deposition of the first silicon-containing layer 154 may have a pressure in a range from about 50 Torr to about 500 Torr.

In some embodiments, the deposition of the first silicon-containing layer 154 may have a deposition temperature in a range from about 550° C. to about 700° C. The deposition temperature is not high enough to dissociate the hydrogen molecule ($H_2$) into hydrogen radicals. Therefore, even when the carrier gas includes the hydrogen gas ($H_2$), the carrier gas is still unreactive, and the wafer 100 would not react with the hydrogen gas ($H_2$) during the deposition of the first silicon-containing layer 154.

In some embodiments, the first silicon-containing layer 154 is an n-type doped silicon-containing epitaxial layer that is doped with phosphorus. The phosphorus-doped silicon-containing epitaxial layer can be referred to as a silicon phosphorus (SiP) layer. In some embodiments, the first silicon-containing layer 154 is an n-type doped silicon-containing epitaxial layer that is doped with both phosphorus and carbon (SiCP). Carbon could impede the out-diffusion of phosphorus from the first silicon-containing layer 154. Other types of dopants may also be included. In some embodiments, the phosphorus dopant has a concentration in a range from about 0.3% (atomic percent) to about 2% (atomic percent). In some embodiments, the carbon dopant has a concentration in a range from about 0.3% (atomic percent) to about 2% (atomic percent).

In some embodiments, the first silicon-containing layer 154 may be formed by chemical vapor deposition (CVD), for example, low-pressure CVD (LPCVD), atomic layer CVD (ALCVD), ultrahigh vacuum CVD (UHVCVD), reduced pressure CVD (RPCVD), or other suitable CVDs; molecular beam epitaxy (MBE) process; other suitable epitaxial processes; or combinations thereof.

A portion of the first silicon-containing layer 154 in the source and drain recesses 152 (as shown in FIG. 4) is removed. In some embodiments, the removal of the first silicon-containing layer 154 may use an etch gas including at least one of hydrogen chloride (HCl), chlorine ($Cl_2$), germanium hydride ($GeH_4$), and other suitable etch gases. The flow rate of the etch gas may be in a range from about 50 standard cubic centimeters per minute (sccm) to about 700 sccm. The removal of the first silicon-containing layer 154 may have a pressure in a range from about 50 Torr to about 500 Torr. In some embodiments, the removal of the first silicon-containing layer 154 may have an etch temperature in a range from about 500° C. to about 700° C.

A second silicon-containing layer 156 is epitaxially deposited on the remaining the first silicon-containing layer 154. In some embodiments, the material and the method of forming the second silicon-containing layer 156 are as same as or similar to those of the first silicon-containing layer 154 as described above. In some embodiments, the second silicon-containing layer 156 may have a dopant concentration different from that of the first silicon-containing layer 154.

A portion of the second silicon-containing layer 156 in the source and drain recesses 152 (as shown in FIG. 4) is removed. The remaining second silicon-containing layer 156 is formed on the remaining first silicon-containing layer 154. In some embodiments, the removal of the second silicon-containing layer 156 is as same as or similar to the removal of the first silicon-containing layer 154 described above.

A third silicon-containing layer 158 is epitaxially deposited to fill the remaining source and drain recesses 152 (as shown in FIG. 4) by a selective epitaxial growth (SEG) process. The SEG process has a higher growth rate than that of the cyclic deposition and etching (CDE) process in accordance with some embodiments. The SEG process is a selective deposition process, and the third silicon-containing layer 158 formed by this process is deposited on the second silicon-containing layer 156. The third silicon-containing layer 158 deposited by the SEG process may be formed beyond the top surface of the semiconductor substrate 110, as shown in FIG. 5, in accordance with some embodiments. In alternative embodiments, the top surface of the third silicon-containing layer 158 may be substantially level with the top surface of the semiconductor substrate 110. In some embodiments, the third silicon-containing layer 158 is doped with phosphorus (SiP).

After formation of the source and drain stressors 150, the process chamber for performing the formation of the source and drain stressors 150 is purged with, for example, hydrogen gas ($H_2$) to remove residual gases in the process chamber (block 60 of FIG. 1). In some embodiments, the purging of the process chamber is performed at a temperature substantially the same as the deposition temperature. Similarly, the temperature of the purging of the process chamber is not high enough to dissociate the hydrogen molecule ($H_2$) into hydrogen radicals. Therefore, the wafer 100 would not react with the hydrogen gas ($H_2$) during the purging of the process chamber.

Figure 6:
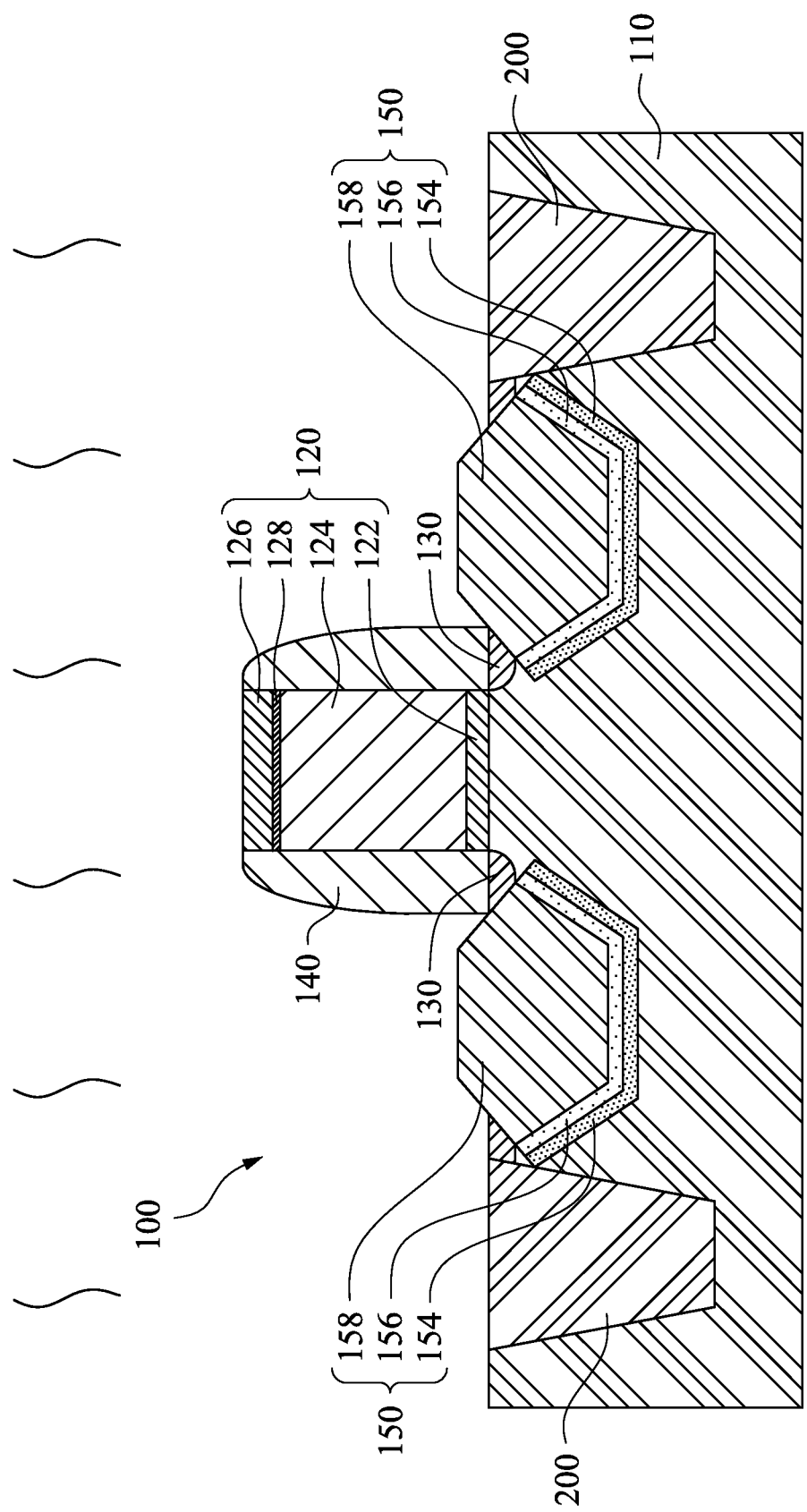

Reference is made to FIG. 6. After the formation of the source and drain stressors 150, top surfaces of the source and drain stressors 150 are hydrogen terminated (block 70 of FIG. 1). During the hydrogen terminating, the temperature of the process chamber is raised, and a hydrogen-containing gas is introduced into the process chamber. Therefore, the wafer 100 is subjected to the heated hydrogen-containing gas to terminate the top surfaces of the source and drain stressors 150. That is, the wafer 100 is heat treated in an atmosphere including the hydrogen-containing gas to terminate the top surfaces of the source and drain stressors 150. The hydrogen-containing gas includes, for example, hydrogen gas ($H_2$). The hydrogen gas ($H_2$) has a flow rate in a range from about 15000 standard cubic centimeters per minute (sccm) to about 30000 sccm. The hydrogen terminating may have a pressure in a range from about 10 Torr to about 100 Torr.

After the formation of the source and drain stressors 150, the top surfaces of the source and drain stressors 150 may have dangling bonds thereon, and therefore the dangling bonds serve as reactive surface sites. The reactive surface sites tend to react with other elements in the atmosphere to form condensation defects. The temperature of the hydrogen terminating (that is, the temperature of the heated hydrogen-containing gas) can dissociate the hydrogen molecule ($H_2$) into hydrogen radicals. The dangling bonds on the top surfaces of the source and drain stressors 150 can be terminated using the hydrogen radicals. For example, dangling bonds at Si atoms can be passivated by hydrogen to form Si—H bonds. Therefore, the reactive surface sites on the top surfaces of the source and drain stressors 150 is reduced.

In some embodiments, the hydrogen terminating is performed at a temperature in a range from about 700° C. to about 900° C. That is, the heated hydrogen-containing gas has a temperature in a range from about 700° C. to about 900° C. If the temperature of the hydrogen terminating is lower than about 700° C., then the temperature of the hydrogen terminating may not dissociate the hydrogen molecule ($H_2$) into hydrogen radicals. If the temperature of the hydrogen terminating is higher than about 900° C., then the hydrogen terminating may significantly increase the thermal budget of the metal-oxide-semiconductor (MOS) device fabrication.

The terms "about" may be applied to modify any quantitative representation which could permissibly vary without resulting in a change in the basic function to which it is related. For example, the temperature of the hydrogen terminating as disclosed herein being in a range from about 700° C. to about 900° C. may permissibly be somewhat less than 700° C. if its terminating capability is not materially altered.

Furthermore, since the temperature of the hydrogen terminating is higher than the deposition temperature, residual gases on the surface of the wafer 100 and/or within the patterned structures of the wafer 100 may be mobilized by the hydrogen terminating. The mobilized residual gases can be removed by purging the process chamber with the hydrogen-containing gas during the hydrogen terminating.

In some embodiments, the purging of the process chamber (block 60 of FIG. 1) may be performed between the formation of the source and drain stressor 150 (block 50 of FIG. 1) and the hydrogen terminating (block 70 of FIG. 1). In alternative embodiments, the purging of the process chamber (block 60 of FIG. 1) may be performed after the hydrogen terminating (block 70 of FIG. 1). In still alternative embodiments, the purging of the process chamber (block 60 of FIG. 1) may be performed at least twice, one is performed between the formation of the source and drain stressor 150 (block 50 of FIG. 1) and the hydrogen terminating (block 70 of FIG. 1), and another is performed after the hydrogen terminating (block 70 of FIG. 1).

After the hydrogen terminating, the wafer 100 is cooled down (block 80 of FIG. 1). During the cooling down, the wafer 100 is transferred to a cool down chamber. In some embodiments, the cool down chamber may be a via between the process chambers of a semiconductor manufacturing equipment for the formation of the source and drain stressors 150 or between the process chambers and a load lock chamber of the semiconductor manufacturing equipment. The wafer 100 stays in the cool down chamber for about 300 seconds to about 500 seconds. The pressure of the cool down chamber is in a range from about 10 Torr to about 100 Torr. When the wafer 100 leaves the cool down chamber, the wafer 100 has a temperature of 230° C. or higher.

When the wafer 100 stays in the cool down chamber, outgassing from the wafer 100 may accumulate and may be redeposited on the wafer 100. Outgassing is the release of a gas that was dissolved, trapped, or absorbed in the wafer 100. In some embodiments, the outgassing gas released from the wafer 100 may include, for example, Cl, $GeH_4$, dichlorosilane ($SiH_2Cl_2$), $PH_3$, $B_2H_6$, or combinations thereof.

In order to prevent the outgassing gas from contaminating the wafer 100, a purge and pump sequence may be performed to remove the outgassing gas when the wafer 100 is cooled down (block 80 of FIG. 1). Purging the cool down chamber with an inert gas can removes the outgassing gas. In some embodiments, the inert gas may be, for example, nitrogen gas ($N_2$). After purging, the cool down chamber may be evacuated or "pumped" to remove gases within the cool down chamber, such as the outgassing gas.

Figure 7:
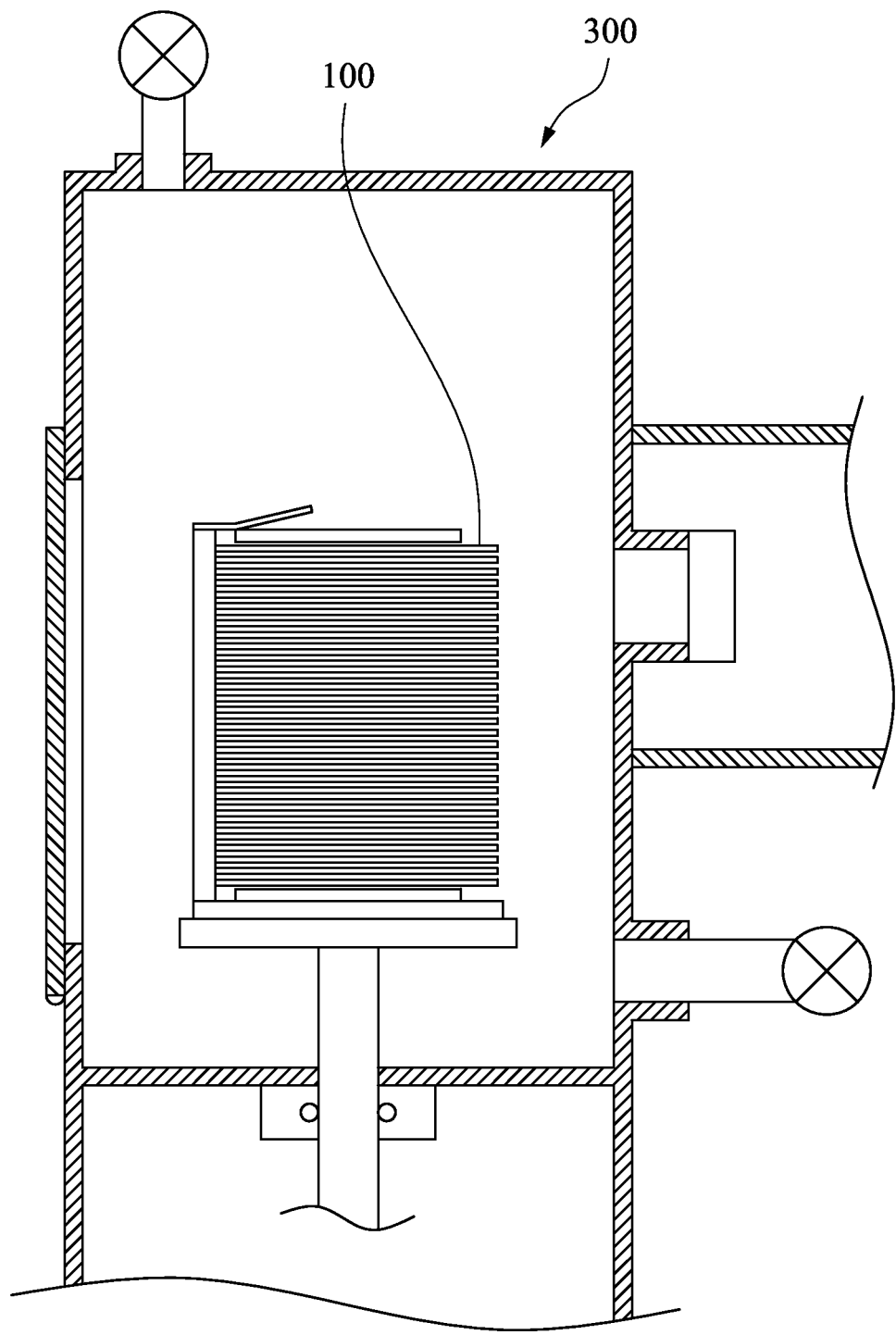
FIG. 7 illustrates a load lock chamber of a semiconductor manufacturing equipment for formation of source and drain stressors of the metal-oxide-semiconductor (MOS) device in accordance with some exemplary embodiments of the present disclosure.

After the wafer 100 is cooled down, the wafer 100 is transferred to a load lock chamber (block 90 of FIG. 1). FIG. 7 illustrates the load lock chamber 300 in accordance with some exemplary embodiments. The load lock chamber 300 is a chamber which temporary contains a plurality of the wafers 100 before the wafers 100 are transferred to a front opening unified pod (FOUP). Similarly, when the wafers 100 stay in the load lock chamber 300, outgassing from the wafers 100 may accumulate and may cross contaminate the wafers 100.

In order to prevent the outgassing gas from cross contaminating the wafers 100, a purge and pump sequence may be performed to remove the outgassing gas (block 95 of FIG. 1). Purging the load lock chamber 300 with an inert gas can removes the outgassing gas. In some embodiments, the inert gas may be, for example, nitrogen gas ($N_2$). After purging, the load lock chamber 300 may be evacuated or "pumped" to remove gases within the load lock chamber 300, such as the outgassing gas. In some embodiments, the purge and pump sequence may be performed periodically—for example every about 1 to 5 wafers 100 transferred into the load lock chamber 300. In the embodiments that the wafer to wafer time interval is 8 minutes, the purge and pump sequence may be performed every about 8 to 40 minutes.

Since the load lock chamber 300 is purged and pumped periodically, a number of the wafers 100 staying in the load lock chamber 300 can increase without concern about cross contamination. In some embodiments, the number of the wafers 100 staying in the load lock chamber 300 can be substantially the same as the capacity of a front opening unified pod (FOUP).

Afterwards, the wafers 100 are stored in the front opening unified pod (FOUP) and then transferred to a wet clean tool. The wet clean tool performs a wet clean process on the wafers 100 to remove organic contaminants, particles, oxide layers, and/or ionic contamination from the wafers 100. The wet clean process may be, for example, RCA clean.

It is understood that for the embodiments shown above, additional steps may be performed to complete the fabrication of the metal-oxide-semiconductor (MOS) device. For example, these additional steps may include formation of replacement metal gate stacks, formation of contacts, formation of interconnect structures (for example, lines and vias, metal layers, and interlayer dielectrics that provide electrical interconnection to the MOS device), formation of passivation layers, and packaging of the MOS device.

As shown in FIG. 6, structurally speaking, the metal-oxide-semiconductor (MOS) device includes the semiconductor substrate 110, the source and drain recesses 152 (as shown in FIG. 4), the source and drain stressors 150, and the gate stack 120. The source and drain recesses 152 (as shown in FIG. 4) is present in the semiconductor substrate 110. The source and drain stressors 150 are n-type and are respectively present in the source and drain recesses 152 (as shown in FIG. 4). At least one of the source and drain stressors 150 has a hydrogen terminated surface. The gate stack 120 is present on the semiconductor substrate 110 and between the source and drain stressors 150.

The hydrogen terminated surface is the top surface of said at least one of the source and drain stressors 150. In the embodiments that said at least one of the source and drain stressors 150 has a plurality of sub-layers, for example, the first silicon-containing layer 154, the second silicon-containing layer 156, and the third silicon-containing layer 158, the hydrogen terminated surface is the top surface of the topest sub-layers. As shown in FIG. 5, the hydrogen terminated surface is the top surface of the third silicon-containing layer 158.

The hydrogen terminated surface means dangling bonds on the hydrogen terminated surface is terminated using hydrogen radicals. Therefore, hydrogen can be observed on the hydrogen terminated surface. In the embodiments that the source and drain stressors 150 include silicon (Si), dangling bonds at Si atoms are passivated by hydrogen to form Si—H bonds, and thus Si—H bonds can be observed on the hydrogen terminated surface by, for example, Fourier transform infrared spectroscopy (FTIR).

In order to reduce the condensation defects on the top surfaces of the source and drain stressors 150, the wafer 100 is subjected to a hydrogen heat treatment to terminate the top surfaces of the source and drain stressors 150. The temperature of the hydrogen heat treatment is high enough to dissociate the hydrogen molecule ($H_2$) into hydrogen radicals. The hydrogen radicals can repair dangling bonds on the top surfaces of the source and drain stressors 150. Therefore, the dangling bonds on the top surfaces of the source and drain stressors 150 would not react with other elements in the atmosphere to form the condensation defects.

In accordance with some embodiments of the present disclosure, a method for manufacturing a semiconductor structure includes forming at least one gate stack on a semiconductor substrate. At least one recess is formed in the semiconductor substrate. At least one n-type stressor is formed in the recess. At least the n-type stressor is heat treated in an atmosphere including a hydrogen-containing gas.

In accordance with some embodiments of the present disclosure, a method for manufacturing a semiconductor structure includes forming at least one gate stack on a semiconductor substrate. At least one recess is formed in the semiconductor substrate. At least one n-type silicon-containing epitaxial layer is formed in the recess, in which the n-type silicon-containing epitaxial layer has at least one dangling bond on its surface. The dangling bond is terminated using at least one hydrogen radical.

In accordance with some embodiments of the present disclosure, a semiconductor structure includes a semiconductor substrate, n-type source and drain stressors, and a gate stack. The semiconductor substrate has source and drain recesses therein. The n-type source and drain stressors are respectively present in the source and drain recesses. At least one of the n-type source and drain stressors has a hydrogen terminated surface. A gate stack is present on the semiconductor substrate and between the n-type source and drain stressors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for manufacturing a semiconductor structure, the method comprising:
forming at least one gate stack on a semiconductor substrate;
forming at least one recess in the semiconductor substrate;
epitaxially forming at least one stressor in the at least one recess in a process chamber;
heat treating the at least one stressor in an atmosphere comprising a hydrogen-containing gas;

prior to heat treating the at least one stressor, purging the process chamber at a temperature lower than a dissociation temperature of $H_2$ to remove residual gases in the process chamber; and removing an outgassing gas released from the at least one stressor.

2. The method of claim 1, wherein the heat treating is performed at a temperature higher than the dissociation temperature of $H_2$.

3. The method of claim 1, wherein the heat treating comprises:

thermally dissociating at least a part of the hydrogen-containing gas into at least one hydrogen radical; and terminating at least one dangling bond on a surface of the at least one stressor using the at least one hydrogen radical.

4. The method of claim 1, further comprising:

transferring the semiconductor substrate to a load lock chamber after the heat treating, wherein the outgassing gas released from the at least one stressor is removed from the load lock chamber.

5. The method of claim 1, further comprising:

cooling down the at least one stressor in a cool down chamber after the heat treating, wherein the outgassing gas released from the at least one stressor is removed from the cool down chamber.

6. The method of claim 1, further comprising:

epitaxially forming the at least one stressor at a first temperature from about 550° C. to about 700° C.; and heat treating the at least one stressor at a second temperature greater than the first temperature.

7. A method for manufacturing a semiconductor structure, the method comprising:

forming at least one gate stack on a semiconductor substrate;

forming at least one recess in the semiconductor substrate;

forming at least one epitaxial layer in the at least one recess at a first temperature in a process chamber, wherein the at least one epitaxial layer has at least one dangling bond on its surface;

terminating the at least one dangling bond at a second temperature greater than the first temperature; and prior to terminating the at least one dangling bond, purging the process chamber with a hydrogen-containing gas to remove residual gases in the process chamber.

8. The method of claim 7, further comprising:

transferring the semiconductor substrate to a load lock chamber after the terminating; and purging the load lock chamber with an inert gas.

9. The method of claim 8, wherein the purging is performed periodically.

10. The method of claim 7, wherein the first temperature is in a range from about 550° C. to about 700° C.

11. A method for manufacturing a semiconductor structure, the method comprising:

forming at least one gate stack on a semiconductor substrate;

forming at least one recess in the semiconductor substrate;

forming at least one epitaxial layer in the at least one recess at a first temperature from about 550° C. to about 700° C.; and after forming the at least one epitaxial layer in the at least one recess at the first temperature, heat treating the at least one epitaxial layer at a second temperature greater than the first temperature.

12. The method of claim 11, further comprising:

purging a process chamber where the forming the at least one epitaxial layer is performed with a hydrogen-containing gas.

13. The method of claim 12, wherein the purging the process chamber is performed at a temperature which is lower than a dissociation temperature of the hydrogen-containing gas.

14. The method of claim 12, further comprising:

hydrogen terminating at least a top surface of the at least one epitaxial layer after the purging.

15. The method of claim 11, wherein the second temperature is in a range from about 700° C. to about 900° C.

16. The method of claim 11, further comprising:

after forming the at least one epitaxial layer in the at least one recess at the first temperature, purging a process chamber at the first temperature.

17. The method of claim 11, further comprising:

cooling down the semiconductor substrate;

after cooling down the semiconductor substrate, transferring the semiconductor substrate to a load lock chamber; and periodically purging the load lock chamber.

18. The method of claim 11, wherein forming the at least one epitaxial layer includes:

depositing a first silicon-containing layer in the at least one recess;

removing a portion of the first silicon-containing layer;

depositing a second silicon-containing layer on the remaining first silicon-containing layer; and removing a portion of the second silicon-containing layer; and filling the at least one recess with a third silicon-containing layer.

19. The method of claim 18, wherein heat treating the at least one epitaxial layer includes terminating dangling bonds on a top surface of the third silicon-containing layer at the second temperature.

20. The method of claim 18, wherein depositing the first and second silicon-containing layers is such that the first and second silicon-containing layers are formed conformally in the at least one recess and filling the at least one recess with the third silicon-containing layer is such that a top surface of the third silicon-containing layer is above a top surface of the semiconductor substrate.

* * * * *